United States Patent [19]

Miyatake

[11] Patent Number: 5,141,322
[45] Date of Patent: Aug. 25, 1992

[54] ILLUMINATION METHODS WITH PLURAL WAVELENGTH RAYS AND WITH WAVELENGTH-BAND RAYS FOR USE IN A DOUBLE-FOCUS DETECTOR UTILIZING CHROMATIC ABERRATION

[75] Inventor: Tsutomu Miyatake, Nihama, Japan

[73] Assignee: Sumitomo Heavy Industries, Co., Ltd., Japan

[21] Appl. No.: 651,246
[22] PCT Filed: Dec. 28, 1989
[86] PCT No.: PCT/JP89/01340
  § 371 Date: Mar. 13, 1991
  § 102(e) Date: Mar. 13, 1991
[87] PCT Pub. No.: WO91/10110
  PCT Pub. Date: Jul. 11, 1991
[51] Int. Cl.⁵ .................... G01B 11/00; H01L 21/027
[52] U.S. Cl. .................................................. 356/401
[58] Field of Search ...................................... 356/401

[56] References Cited

U.S. PATENT DOCUMENTS 4,918,301  4/1990  Miyatake .............................. 250/216
5,026,976  6/1991  Miyatake .......................... 250/201.7

Primary Examiner—Richard A. Rosenberger
Attorney, Agent, or Firm—Ostrolenk, Faber, Gerb & Soffen

[57] ABSTRACT

A double-focus detector utilizing chromatic aberration has a lens system having axial chromatic aberration in which a first object such as a mask is illuminated with a ray of wavelength below 500 nm and a second object such as a wafer is illuminated with plural wavelength rays or a wavelength-band ray above 500 nm, by employing an image forming plane of the first object with respect to the single wavelength ray as one focal plane of the lens system and the same image forming plane of the second object with respect to the plural wavelength rays or the wavelength-band ray as the other focal plane of the lens system.

2 Claims, 15 Drawing Sheets

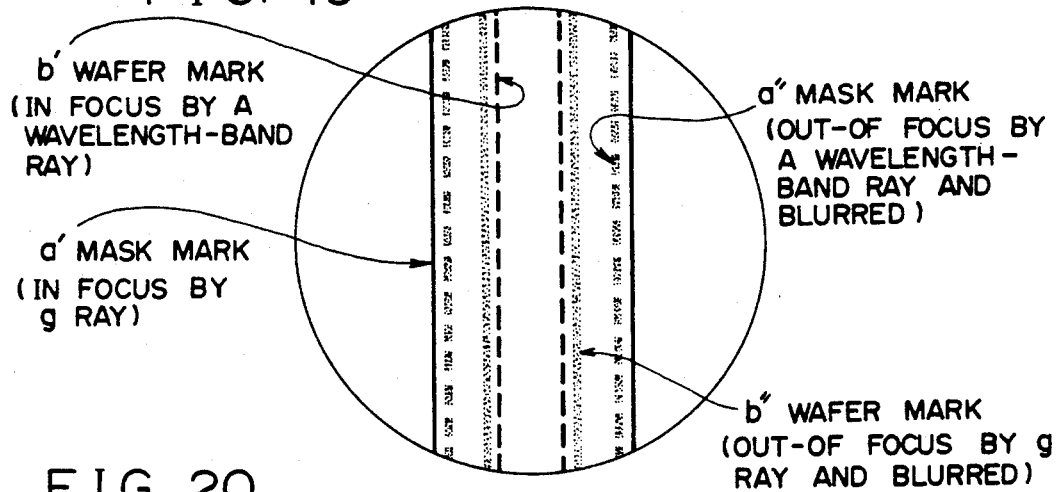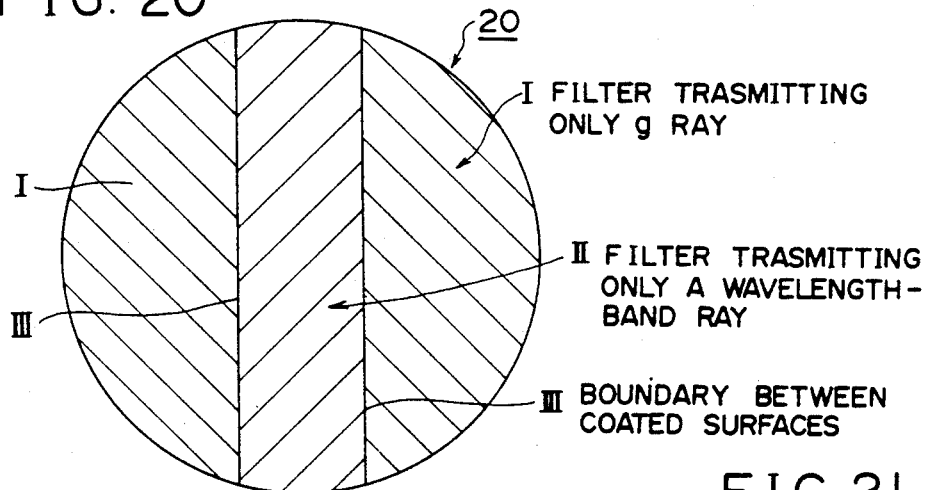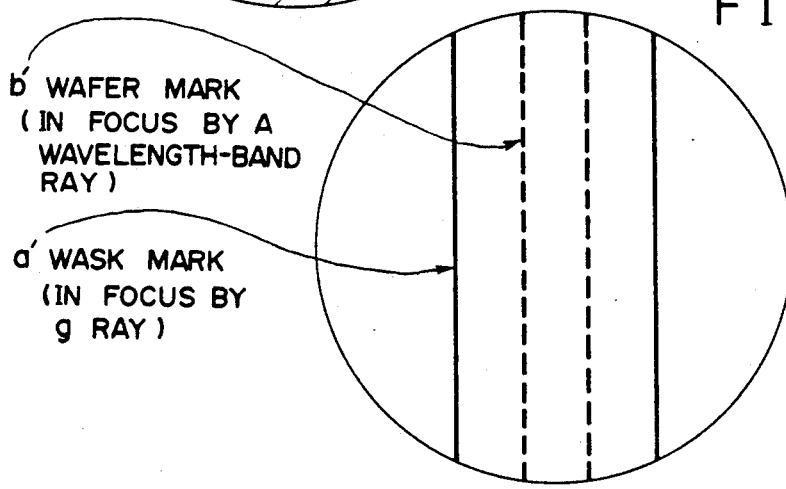

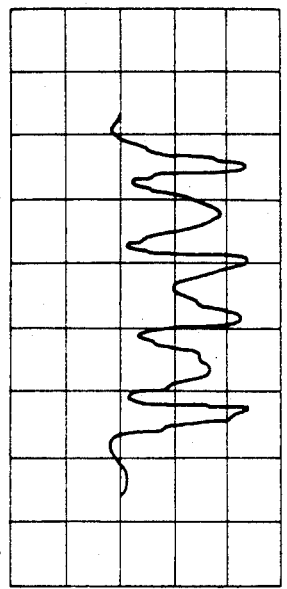
FIG. 24(C) VIDEO PROFILE
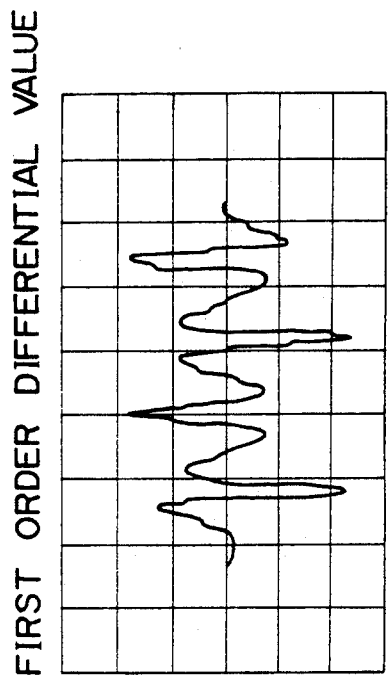
FIG. 24(C) FIRST ORDER DIFFERENTIAL VALUE
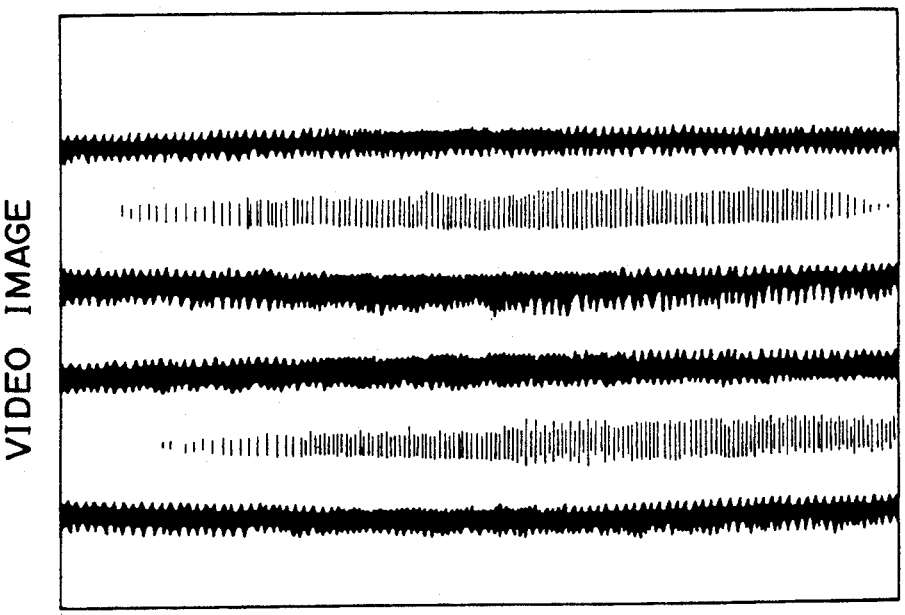
FIG. 24(A) VIDEO IMAGE

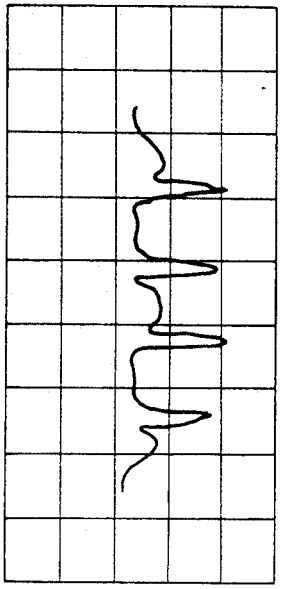
FIG. 25(B) VIDEO PROFILE
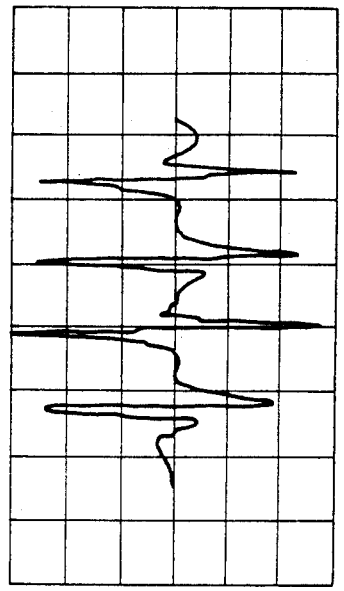
FIG. 25(C) FIRST ORDER DIFFERENTIAL VALUE
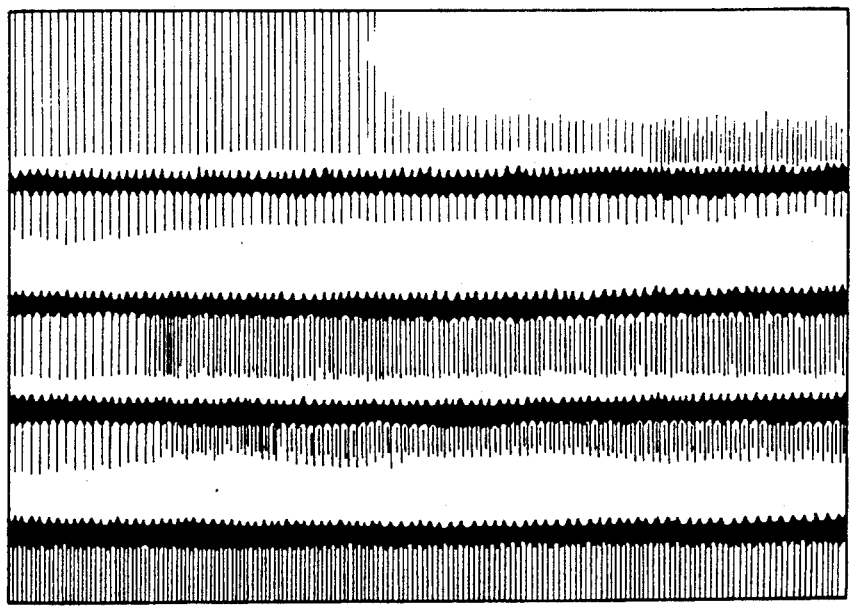
FIG. 25(A) VIDEO IMAGE

VIDEO PROFILE

FIRST ORDER DIFFERENTIAL VALUE

VIDEO IMAGE

VIDEO PROFILE

FIRST ORDER DIFFERENTIAL VALUE

VIDEO IMAGE

ILLUMINATION METHODS WITH PLURAL WAVELENGTH RAYS AND WITH WAVELENGTH-BAND RAYS FOR USE IN A DOUBLE-FOCUS DETECTOR UTILIZING CHROMATIC ABERRATION

FIELD OF INDUSTRIAL USE

The present invention relates to illumination methods with plural wavelength rays and with wavelength-band rays when a double-focus optical apparatus utilizing chromatic aberration is applied to a position detector such as an X-ray exposure apparatus.

BACKGROUND OF THE ART

In a stepper such as an X-ray exposure apparatus, it is necessary to adjust a mask and a wafer in place with a high accuracy.

In a stepper, a resist film, transparent film and the like are provided on a surface of a wafer. Since these films are not uniformly formed, a reflection intensity of an alignment mark on the wafer varies sinusoidally due to a standing wave effect based on optical interferences and a relative intensity of signal rays to detect the alignment mark varies largely, resulting in that an accuracy of alignment is remarkably reduced.

To eliminate such disadvantages and improve the accuracy of alignment a variety of proposals have been offered. For example, the scientific lecture report of the 48th Meeting of Applied Physics Society (the second separate volume 18a-F-6, P.426, Autumn, 1987) shows that when two wavelength rays or two inclination illuminations are applied in detection an alignment mark on a wafer in a bright visual field, the unsymmetry of a detected pattern with respect to unevenness in resist coating is reduced to improve an accuracy of detecting a mark.

In a stepper manufactured by CENSOR company, two rays of wavelengths of 547 nm (e ray) and 578 nm (d ray) are employed as an alignment ray and when a sufficient signal ray is not obtained by one of the rays, a changeover to the other wavelength ray is made to conduct an alignment operation. According to experiments conducted by CENSOR, a relation between alignment signals by the two wavelength rays and a film thickness is shown in FIG. 15 (The practical hand-book of apparatus for manufacturing semiconductors, Science Forum Co. Ltd, PP. 224 to 225, Dec. 25, 1984).

Furthermore, LFF Process Control Division reports sinusoidal variation in reflection intensity due to interferences caused by each of two rays of wavelengths of 405 nm (h ray) and 436 nm (g ray) and variation in reflection intensity due to interferences caused by plural wavelength rays of g ray+h ray and g ray+h ray+i ray (LEE Corporation Process Control Division (60), Trapelo Road Walhm, Mass. 02154, (617) 890 to 2000).

This gives, as shown in FIG. 16, that with two wavelength rays of g+e an interference intensity of reflected rays is greatly improved at 10,000±200 Å.

An example of contemplating improvement in terms of process has been indicated in the scientific lecture report of the 48th Meeting of Applied Physics Society (the second separate volume 18a-F-9, P.427, Autumn, 1987). According to the report, variations in interference intensity and unsymmetry of a mark are reduced by making thickness of a resist film on a wafer uniform to improve an accuracy of alignment.

DISCLOSURE OF THE INVENTION

There are many cases that a transparent thin film such as resist, $SiO_2$, $Si_3O_4$ or the like is formed on a wafer mark. When a single wavelength ray is employed for alignment in an optical aligner, optical stepper, X-ray aligner and the like, a reflection intensity of a wafer mark signal is reduced due to the standing wave effect in these thin film with variation in film thickness on a wafer and a contrast of optical images is reduced. As a result, an accuracy of alignment is greatly reduced ("Precision machinery", Vol. 5 PP.156 to 161, 1985).

In the case that a film formed on a wafer surface is a single layer and two layers, an intensity of rays reflected by a wafer mark is given by the following equation.

A reflectivity of a single layer film:

$$Ir(2.0) = \left| \frac{r_{2.1} + r_{1.0} e^{i\epsilon_2}}{1 + r_{2.1} \cdot r_{1.0} e^{i\epsilon_1}} \right|^2 \tag{1}$$

where $r_{1.0}$ represents an amplitude reflectivity of a wafer mark to the first layer film and $r_{2.1}$ represents an amplitude reflectivity of the first layer film to the atmosphere.

A reflectivity of a two-layer film:

Let it be that $r_{3.2}$ represents an amplitude reflectivity of the second layer to the atmosphere, $n_0$ represents a refractive index of a wafer, $k_0$ represents an attenuation factor of a wafer, $n_1$ and $n_2$ represent respective refractive indexes of first and second layer film, $n_3$ represents a refractive index of air, $\lambda$ represetnts a wavelength of incident ray and $d_1$ and $d_2$ represent respective thickness of first and second layer film.

$$Ir(3.0) = \left| \frac{r_{3.2} + \left( \frac{r_{2.1} + r_{1.0} \cdot e^{i\epsilon_1}}{1 + r_{2.1} r_{1.0} e^{i\epsilon_1}} \right) e^{i\epsilon_2}}{1 + r_{2.1} r_{1.0} e^{i\epsilon_2}} \right|^2 \tag{2}$$

$$r_{1.0} = \frac{(n_0 - ik_0) - n_1}{(n_0 - ik_0) + n_1}$$

$$r_{2.1} = \frac{n_2 - n_1}{n_2 + n_1}$$

$$r_{3.2} = \frac{n_3 - n_2}{n_3 + n_2}$$

$$\epsilon_1 = \frac{4\pi n_1 d_1}{\lambda}$$

$$\epsilon_2 = \frac{4\pi n_2 d_2}{\lambda}$$

It will be found from the foregoing equations (1) and (2) that a reflection intensity of a wafer mark depends upon a refractive index and film thickness of a material formed on a mark and varies sinusoidally with variation of the material.

Table 1 shows a cycle in variation of mark reflectivity and maximun and minimum reflectivity when a film thickness of the material is changed in a single layer film. Table 2 shows those in a two-layer film.

TABLE 1

| | Mark reflectivity of single layer λ = 6000 Å | | | |
|---|---|---|---|---|
| Layer | Refractive index | Cycle Å | Maximum reflectivity | Minimum reflectivity |
| $SiO_2$ | 1.45 | 2050 | 31.9 | 7.0 |
| $Si_3N_4$ | 1.90 | 1550 | 32.3 | 0.0 |
| Poly-Si | 3.00 | 1000 | 35.7 | 15.0 |

TABLE 2

| | Mark reflectivity of double layers λ = 6000 Å | | | |
|---|---|---|---|---|
| Layer | Refractive index | Cycle Å | Maximum reflectivity | Minimum reflectivity |
| FBM | 1.50 | 1000 | 16.0 | 0.0 |
| $Si_3N_4$ | 1.90 | 800 | 14.7 | 0.0 |
| FBM | 1.50 | 1000 | 16.2 | 0.0 |
| Poly-Si | 3.00 | 500 | 7.6 | 0.0 |
| Poly-Si | 3.00 | 500 | 31.9 | 0.0 |
| $SiO_2$ | 1.45 | 1000 | 31.0 | 0.0 |

From these tables, it will be read how the reflectivity varies with respect to a change of film thickness.

As such, in each process when ① a resist including a light absorber, ② an anti-reflective-coating (ARC) film, or ③ a multilayer resist is employed, which have spread with late super-micronization in a stepper, it is difficult to conduct alignment with a single wavelength ray.

When a single wavelength ray is employed for alignment in a multilayer resist, the longer a wavelength of a ray is, the higher an accuracy of alignment is. This is because a light absorption index of a lower layer resist, which is inversely proportional to a wavelength, is reduced and the reflectivity of an alignment mark is increased, as a wavelength of light ray employed increases, resulting in the improvement of detection accuracy in alignment. FIG. 12 shows how a light absorption index is reduced as a wavelength increases (Semiconductor World Vol. 7, 1984)

When alignment is conducted with a single wavelength ray in a three-layer resist, an alignment accuracy is also improved as a wavelength of the ray increases. FIG. 13 is a diagram of the reflection characteristics of an aluminum substrate coated with a resist film which are indicated by a wavelength and a baking temperature. In FIG. 13, it will be found that when e and d ray, whose wavelengths are larger than that of g ray, are employed, a transmittivity and a reflection intensity are increased, which are advantageous to alignment detection.

FIG. 14 illustrates reflection characteristics of a lower resist with respect to a baking temperature in relation with g ray (436 nm), e ray (546 nm) and d ray (577 nm) ("Semiconductor World, Vol. 5, 1986; Press Journal Co., Ltd. P. 74). In FIG. 14, it will be found that the longer wavelength a ray has, the less deterioration an alignment mark siganl ray has with respect to a rise of a baking temperature.

To solve the foregoing problems, the two following measures are considered.

① To decrease light interferences by employing a plurality of rays having longer wavelengths, for example, e and d ray, as alignment rays.

② To make improvement in the process aspect.

The present invention adopts the above measure ① which is an essential method out of the two for solving the problems.

It is an object of the present invention to provide an illumination method which is capable of largely improving an alignment accuracy, simplifying process measures and obtaining a remarkably high alignment accuracy as well as a high throughput, when a double-focus optical apparatus utilizing chromatic aberration, which has been proposed in my Japanese Patent Application No. Sho 62-196174, is employed as a position detector for use in an aligner such as an X-ray exposure apparatus, in order to clear off various problems involved in alignment with a single wavelength ray.

BRIEF DESCRIPTION OF THE DRAWINGS

FIG. 19 is a diagram showing the condition that alignment marks are superposed on an image receiving plane;

FIG. 20 is a front view showing a structure of a pattern barrier filter;

FIG. 21 is a diagram showing observation of alignment marks;

FIGS. 24(A), (B) and (C) are graphs showing a video image, video profile and first order differential value of the video profile which are detected by employing a single wavelength ray (e ray) as an illumination ray, respectively;

FIGS. 25(A), (B) and (C) are graphs showing a video image, video profile and first order differential value of the video profile which are detected employing plural wavelength rays (e and d ray);

EMBODIMENTS

A double-focus detector utilizing chromatic aberration (Japanese Patent Application Sho 62-196174) will be first described briefly.

Figure 4:
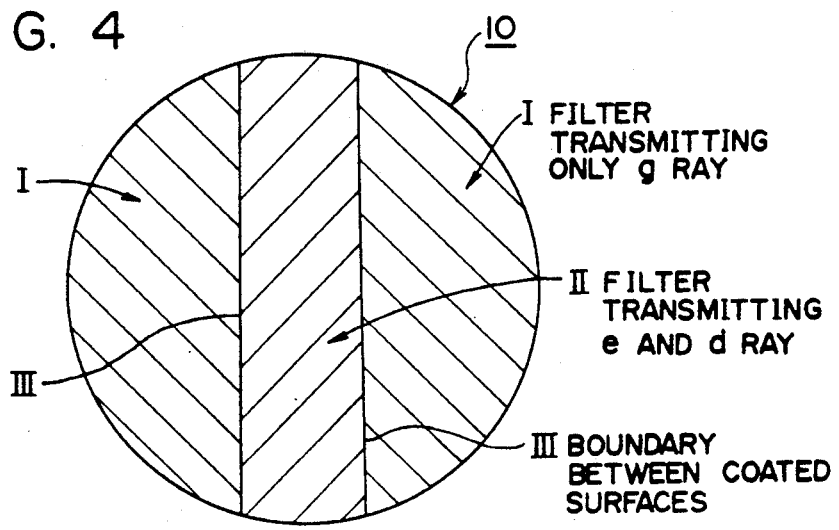
FIG. 4 is a schematic diagram showing an example of a filter.
Figure 6:
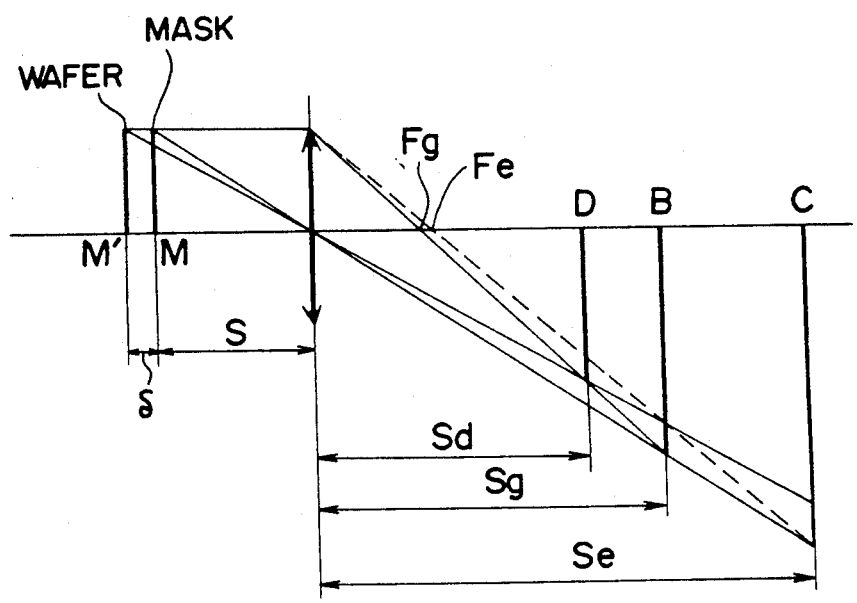
FIG. 6 is a diagram for explaining the principle of a double-focus detector utilizing chromatic aberration.
Figure 7:
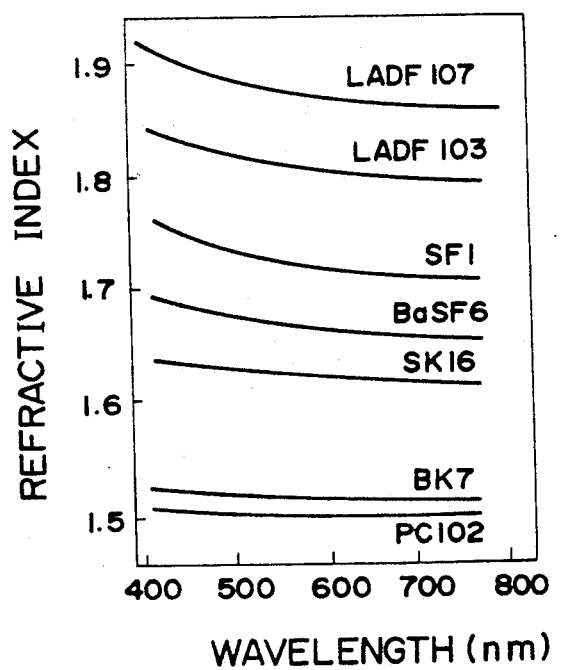
FIG. 7 is a diagram showing the relation between a refractive index of a glass material and a wavelength of a ray.

An objective has chromatic aberration with respect to rays of different wavelengths. For example, it has different focal lengths to two rays of g ($\lambda = 435$ nm) and e ($\lambda = 546$ nm). Consequently, images of a mark which are formed by a g and e ray lie at different points. By way of example, focal lengths of an objective of numerical aperture N.A. = 0.4 and a magnification n = 10 to e and g ray are Fe = 12.5 mm and Fg = 12.741 mm, respectively. Image point distances S formed when an object distnace S is 13.75 mm, are Sg = 137.5 mm and Se = 137.615 mm. Two objects such as a mask and a wafer are disposed, as shown in FIG. 6, at respective points M and M' at an minute interval $\delta$. With the above objective, images of a mark on the mask are formed at points D and B and images of a mark on the wafer are formed at points B and C, by g and e ray, since focal lengths Fg and Fe by g ray shown with a solid line and e ray shown with a broken line are different. Thus, by chromatic aberration of the objective, images of the marks on the mask and wafer are formed at the same point B, the image of the mark on the mask being formed by g ray and the image of the mark on the wafer being formed by e ray. Making observation by putting a detector device such as a television camera at the point B, the marks on the mask and wafer can be simultaneously viewed, together with blurred images. When a pattern barrier filter which combines a filter for cutting off g ray and transmitting the e ray and a filter (see, for example, FIG. 4) for transmitting the g ray and cutting off the e ray is employed to remove blurred images caused due to chromatic aberration, it is possible to simultaneously observe the images of alignment marks on the mask and wafer which images lie at different positions, the point B. An objective for use in the present invention is the one that chromatic aberration is positively produced and various aberrations are properly compensated. Table 3 shows an example of specification of the optical system.

TABLE 3

Specification for an optical system
--(lengths and distances are in mm units)--.
(including an objective, field lens and relay lens)

Total optical length = 488.135

TABLE 3-continued

Specification for an optical system
--(lengths and distances are in mm units)--.
(including an objective, field lens and relay lens)

| | |
|---|---|
| Focal length | = −1.830 |
| Rear focal point | = −0.731 |
| Front focal point | = 275.496 |
| Entrance pupil | = 275.496 |
| Entrance diameter | = +1.464 |
| Entrance magnification | = −0.234 |
| Exit pupil | = ******** |
| Exit magnification | = ********** |
| Object distance | = −1.000 |
| Magnification (reciprocal) | = −0.666660 · 10$^{-2}$ |
| Image distance | = 1.2202 |

Next, a double-focus detector, in which three rays of different wavelengths are employed, one for forming an image of a mask and the other two for forming an image of a wafer, will be described hereinafter.

In order to be related to the foregoing description, three rays of g ($\lambda = 436$ nm), e ($\lambda = 546$ nm) and d ($\lambda = 587$ mm) are used.

In practice, a general optical system is compensated in chromatic aberration, that is, achromatized, with respect to each use, so as not to cause deterioration in image formation due to a wavelength of a ray.

In ordinary achromatization, chromatic aberration is compensated such that an image is not shifted with respect to two specific wavelength rays. Such a achromatized lens system to two wavelength rays is called an achromat.

Now, the principle of a general achromatic lens will be described hereinafter taking e and g ray as examples.

For the sake of brevity, employing the so-called thin lens whose thickness is zoro, conditions of achromatization will be obtained in the following.

Figure 8:
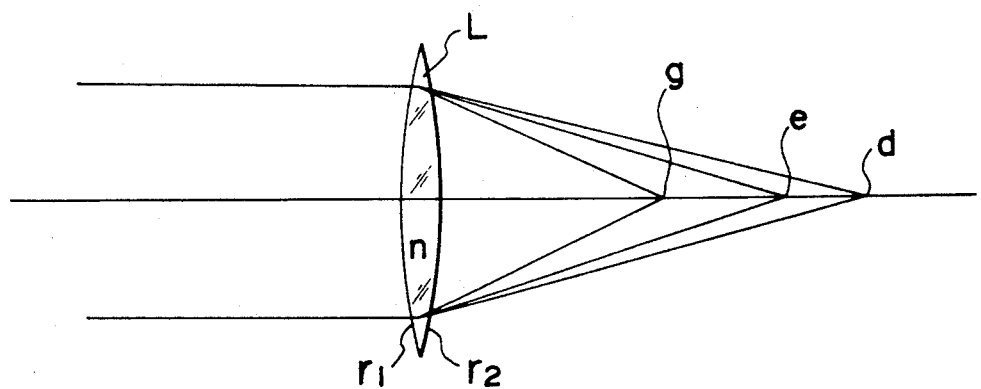
FIG. 8 is a diagram for explaining chromatic aberration of a lens.

In FIG. 8, assuming that radii of curvatures of a thin lens L are $r_1$ and $r_2$ and a refractive index of the lens is n, a focal length f of the lens L is:

$$\frac{1}{f} = (n - 1) \frac{1}{r_1} - \frac{1}{r_2} \qquad (3)$$

In the above equation (3), since a refractive index n of the lens L is reduced even with the same glass material as a wavelength increases, the longer a wavelength is, the more away a focus is formed from the lens ("Light pencil" Vo.25 No.12, 1984, New technical communication Co., Ltd., P.71).

Accordingly, when three rays of g, e and d having different wavelengths are applied to a lens L in parallel, as shown in FIG. 8, three different focuses g, e and d are formed, thus producing the so-called chromatic aberration. To achromatize this, focal lengths to e (green) and d (yellow) ray are equalized, as will be described in the following.

Figure 9:
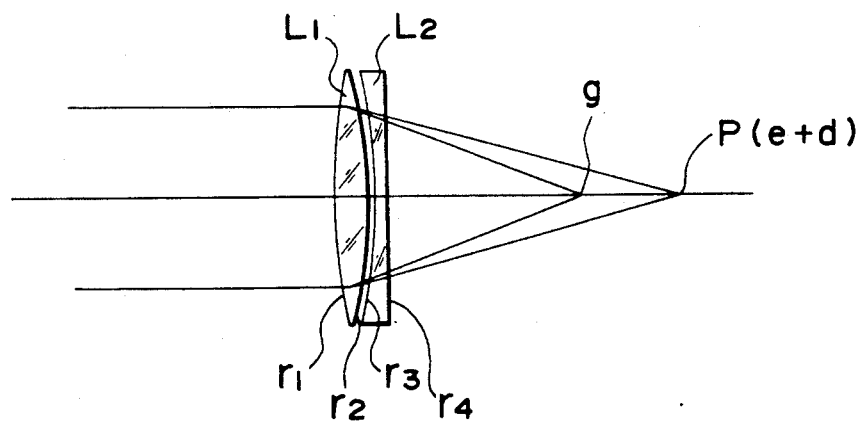
FIG. 9 is a diagram for explaining achromatization of a lens.

As shown in FIG. 9, when two thin lenses $L_1$ and $L_2$ are placed in contact with each other, focal lengths $f_1$ and $f_2$ of the lenses $L_1$ and $L_2$ are:

$$\frac{1}{f_1} = (n_1 - 1) \frac{1}{r_1} - \frac{1}{r_2} \qquad (4)$$

$$\frac{1}{f_2} = (n_2 - 1) \frac{1}{r_3} - \frac{1}{r_4} \qquad (5)$$

where $n_1, n_2$ = refractive indexes of the lenses $L_1$ and $L_2$ $r_1, r_2$ = radii of first and second surface of the lens $L_1$, and $r_3, r_4$ = radii of first and second surface of the lens $L_2$ A focal length f of a compound lens system of two lenses $L_1$ and $L_2$ is:

$$\frac{1}{f} = \frac{1}{f_1} + \frac{1}{f_2} \quad (6)$$

From the equations (4), (5) and (6), resultant focal lengths $f_e$, $f_d$ to two e and d ray are given in the following.

$$\frac{1}{f_e} = \frac{1}{f_{1e}} + \frac{1}{f_{2e}} = (n_{1e} - 1)\frac{1}{r_1} - \frac{1}{r_2} + (n_{2e} - 1)\frac{1}{r_3} - \frac{1}{r_4} \quad (7)$$

$$\frac{1}{f_d} = \frac{1}{f_{1d}} + \frac{1}{f_{2d}} = (n_{1d} - 1)\frac{1}{r_1} - \frac{1}{r_2} + (n_{2d} - 1)\frac{1}{r_3} - \frac{1}{r_4} \quad (8)$$

where $f_{1e}, f_{2e}$ are respective focal lengths of the lenses $L_1$ and $L_2$ to e ray, $f_{1d}, f_{2d}$ are respective focal lengths of the lenses $L_1$ and $L_2$ to d ray.

$n_{1e}, n_{2e}$ are respective refractive indexes of the lenses $L_1$ and $L_2$ to e ray, and $n_{1d}, n_{2d}$ are respective refractive indexes of the lenses $L_1$ and $L_2$ to d ray.

The condition of achromatization is that the resultant focal lengths with respect to e and d ray agree with each other, so that it may be set as follows.

$$\frac{1}{f_e} = \frac{1}{f_d} \quad (9)$$

Substituting the equations (7) and (8) for the equation (9), we have:

$$(n_{1e} - 1)\frac{1}{r_1} - \frac{1}{r_2} + (n_{2e} - 1)\frac{1}{r_3} - \frac{1}{r_4} = \quad (10)$$

$$(n_{1d} - 1)\frac{1}{r_1} - \frac{1}{r_2} + (n_{2d} - 1)\frac{1}{r_3} - \frac{1}{r_4}$$

Thus the equation (10) is the condition of achromatization. In the equation (10), radii of curvatures of the lenses $L_1$, $L_2$ are eliminated as follows.

Focal lengths $f_{1g}$ and $f_{2g}$ of the lenses $L_1$ and $L_2$ to g ray are given by the equations (4) and (5).

$$\frac{1}{f_{1g}} = (n_{1g} - 1)\frac{1}{r_1} - \frac{1}{r_2} \quad (11)$$

$$\frac{1}{f_{2g}} = (n_{2g} - 1)\frac{1}{r_3} - \frac{1}{r_4} \quad (12)$$

where $n_{1g}$ and $n_{2g}$ represent refractive indexes of the lenses $L_1$ and $L_2$ to g ray.

From the equations (11) (12), $$\frac{1}{r_1} - \frac{1}{r_2} = \frac{1}{n_{1g} - 1} \cdot \frac{1}{f_{1g}} \quad (13)$$

$$\frac{1}{r_3} - \frac{1}{r_4} = \frac{1}{n_{2g} - 1} \cdot \frac{1}{f_{2g}} \quad (14)$$

Substituting the equations (13), (14) for the equation (10), we have:

$$\frac{n_{1e} - 1}{n_{1g} - 1} \cdot \frac{1}{f_{1g}} + \frac{n_{2e} - 1}{n_{2g} - 1} \cdot \frac{1}{f_{2g}} = \quad (14)$$

$$\frac{n_{1d} - 1}{n_{1g} - 1} \cdot \frac{1}{f_{1g}} + \frac{n_{2d} - 1}{n_{2g} - 1} \cdot \frac{1}{f_{2g}}$$

Rearranging the equation (15) and transposing it to the left, we have:

$$\frac{n_{1e} - n_{1d}}{n_{1g} - 1} \cdot \frac{1}{f_{1g}} + \frac{n_{2e} - n_{2d}}{n_{2g} - 1} \cdot \frac{1}{f_{2g}} = \phi \quad (14)$$

The term $\dfrac{n_{1e} - n_{1d}}{n_{1g} - 1}$ represents the dispersion of the lens $L_1$, $$\frac{1}{f_{1g}}$$

represents the focal length of the lens $L_1$ to g ray, $$\frac{n_{2e} - n_{2d}}{n_{2g} - 1}$$

represents the dispersion of the lens $L_2$ and $$\frac{1}{f_{2g}}$$

represents the focal length of the lens $L_2$ to g ray.

In the equation (14), employing $\nu_1$ and $\nu_2$ for the respective terms denoting a dispersion, we obtain:

$$\frac{\nu_1}{f_{1g}} + \frac{\nu_2}{f_{2g}} = \phi \quad (17)$$

where $\nu_1 = \dfrac{n_{1e} - n_{1d}}{n_{1g} - 1}$ $\nu_2 = \dfrac{n_{2e} - n_{1d}}{n_{2g} - 1}$ The equation (17) is the requirement of achromatization.

In addition, it will be found from the equation (17) that since $\nu_1$ and $\nu_2$ both are a positive number ($\nu_1 \neq \nu_2$), $f_{1g}$ and $f_{2g}$ necessarily have different signs. This means that when one ($L_1$) of the lenses $L_1$, $L_2$ is convex, the other one ($L_2$) is concave.

In the foregoing description of the principle of a general achromat, achromatization to e and d ray has been set forth citing an example. This is summarized as follows.

Achromatization to two rays requires at least two concave and convex lenses which have different dispersions. For example, when e and d ray are chosen, the requirement of achromatization is expressed by the equation (17). When an achromat lens system which satisfies the equation (17) is used, as shown in FIG. 9, it has a focus g to g ray and another focus P at which foci to e and d ray agree wtih each other. In addition, chromatic aberration characteristics of an achromat lens system which satifies the equation (15) are shown with a curve A in FIG. 10. For reference, the case of a general photographic achromatization is also shown for comparison with a curve B in FIG. 10.

Figure 10:
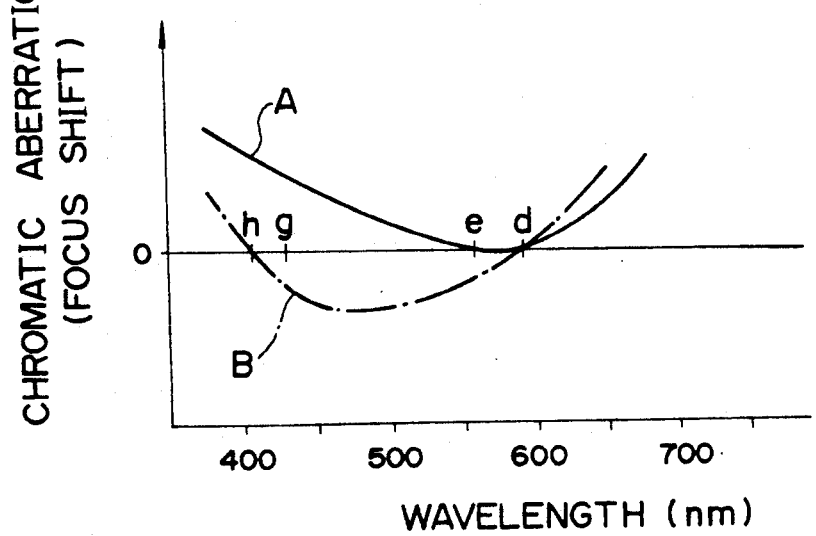
FIG. 10 is a diagram of chromatic aberration curves.

Next, we consider the case that an achromat lens system having chromatic aberration characteristics shown in FIGS. 9 and 10 and satisfying the equation (17) is applied to a double-focus lens utilizing chromatic aberration which has been previously cited.

In FIG. 6, with which the principle of a double-focus lens is described, let us suppose that three rays of g, e and d are applied to an achromat lens satisfying the equation (17).

Let it be that a focal length to d rays is $F_d$. Since focal lengths to e and d ray are equal, then $$F_e = F_d \qquad (18)$$

Figure 1:
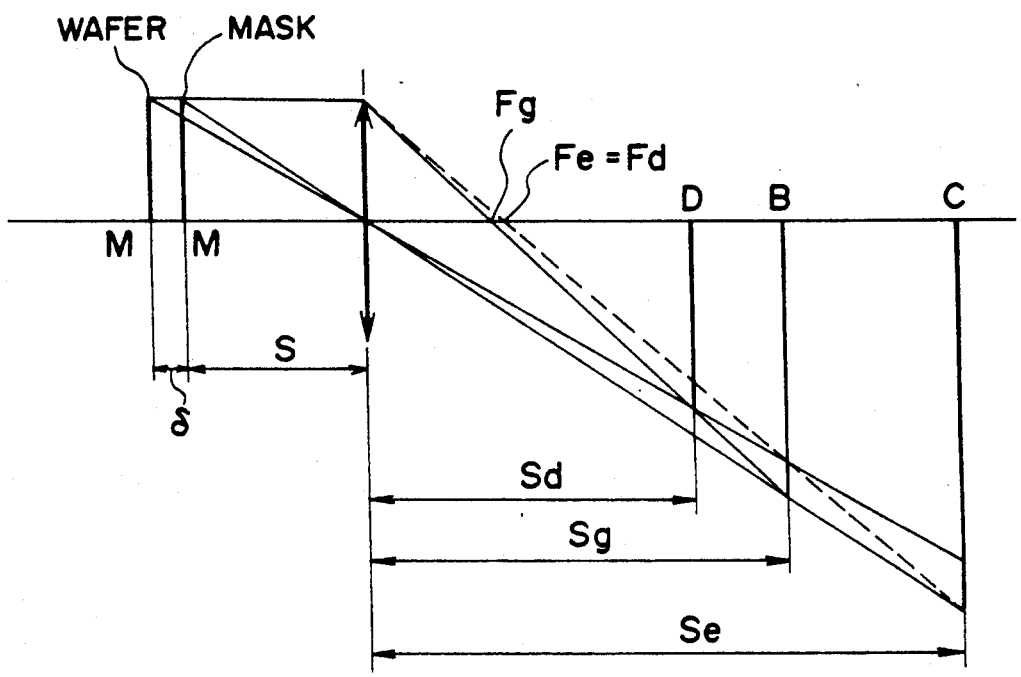
FIG. 1 is a diagram for explaining the principle of plural wavelength ray illumination method according to the present invention.

From this relation, in FIG. 6, an image forming plane to d ray is added to an image forming plane to e ray, resulting in the state of image formation shown in FIG. 1.

Consequently, images shown in Table 4 are formed at the points B, C and D in FIG. 1.

TABLE 4

| Image forming point | Kind of image | Wavelength of image |
|---|---|---|
| B | Mask | g |
|   | Wafer | e & d |
| C | Mask | e & d |
| D | Wafer | g |

Figure 3:
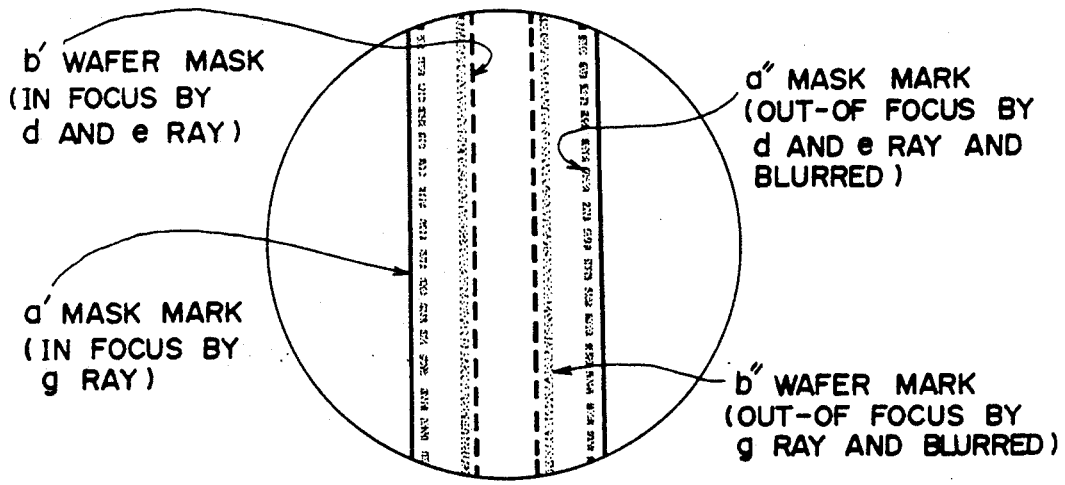
FIG. 3 is a diagram showing the condition that alignment marks are superposed on an image receiving plane.

According to Table 4, images to two rays of e and d are formed at the point B. When configurations of alignment marks a, b on a mask and wafer are respectively a square and a rectangle which is smaller than the square, images formed at the point B are observed as shown in FIG. 3. Specifically, a sharp image a' of a mask mark a which is in-focus to g ray and a blurred image a" of the mask mark a which is out-of-focus to d and e ray, are viewed on the outer sides and a sharp image b' of a wafer mark b which is in-focus to d and e ray and a blurred image b" of the wafer mark b which is out-of-focus to g ray, are viewed on the inner sides.

Thus, blurred images, which disadvantageously reduce a resolution power, are produced at the same time. In order to remove blurred images, a pattern barrier filter 10 is provided through which rays pass. The pattern barrier filter 10 includes its center portion II formed by a coating to transmit e and d ray and its left and right side I to transmit g ray.

Figure 5:
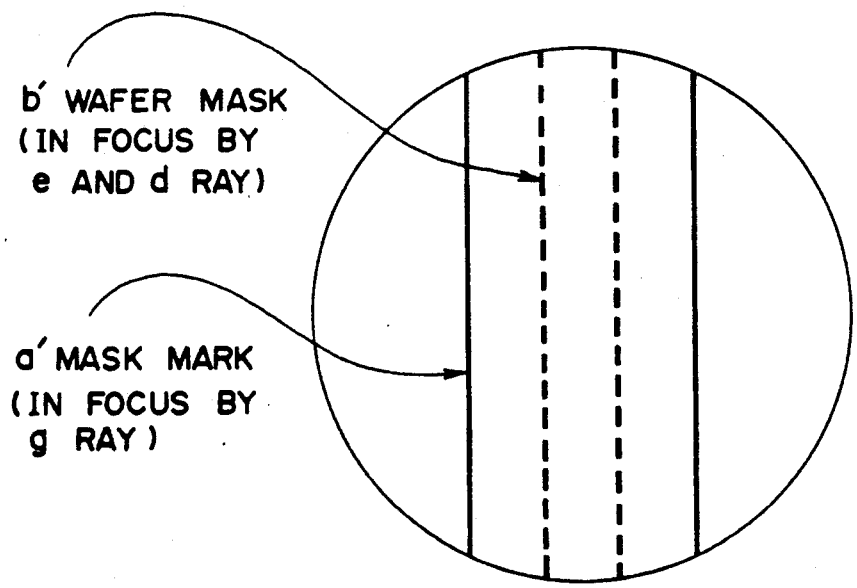
FIG. 5 is a diagram showing observation of alignment marks.

Accordingly, making observation by superposing the pattern barrier filter 10 shown in FIG. 10 on an image forming plane shown in FIG. 3, as shown in FIG. 5, blurred images are removed by the pattern barrier filter 10 and only the required sharp images a', b' of the mask and wafer mark could be observed.

While the foregoing is the principle of applying three wavelength rays to a chromatic aberration detector, the following explains the principle of applying a wavelength-band ray to a chromatic aberration detector.

Figure 17:
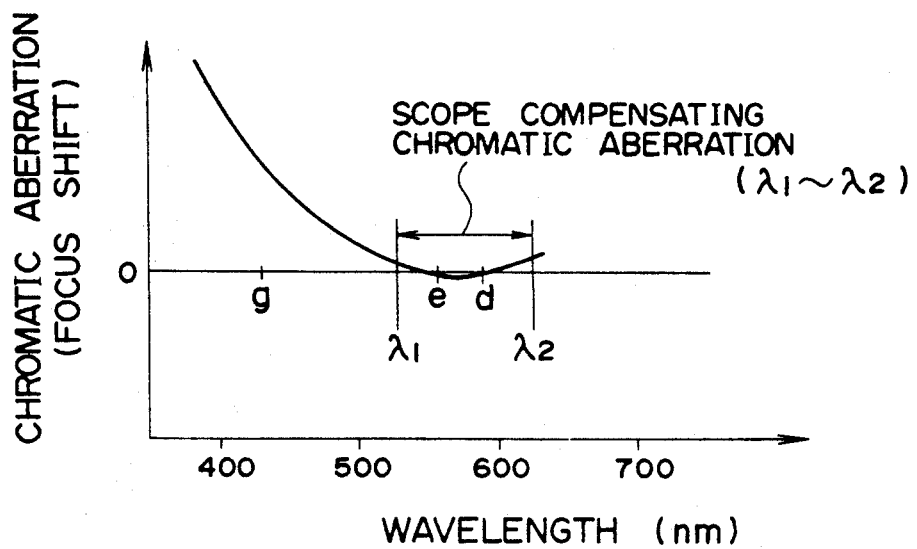
FIG. 17 is a diagram of chromatic aberration curves.

Aberration characteristics in the vicinity of e and d ray shown in FIG. 10 are somewhat modified as shown in FIG. 17. Since there are a large number of modifications in aberration characteristic by detailed optical design, a typical example of common characteristics is dealt with here.

A difference between FIGS. 17 and 10 is that while in FIG. 10 a close compensation of chromatic aberration to e and d ray is made, in FIG. 17 such close compensation to e and d ray is not necessarily made and a compensation of chromatic aberration is made in a scope of wavelengths $\lambda_1$ to $\lambda_2$ in the vicinity of e and d ray.

Accordingly, an objective having characteristics shown in FIG. 17 is an achromat lens having a sufficient resolution power (accomodating to N.A.) to each of a single wavelength ray (g ray shown in FIG. 17) and the wavelength-band ray.

Next, the application of an achromat lens system having chromatic aberration characteristics shown in FIG. 17 to a double-focus lens utilizing chromatic aberration previously cited will be described hereinafter.

In FIG. 6, which explains the principle of a double-focus lens, let it be that a single wavelength ray of g and a ray of wavelength-band $\lambda_1$ to $\lambda_2$ are applied to a lens having chromatic aberration characteristics showin in FIG. 17.

With respect to a focal length to a ray of wavelength-band $\lambda_1$ to $\lambda_2$, although, strictly speaking, there is a focal length to only two wavelength rays selected in design of an achromat lens (a large number of combinations of any two wavelengths between $\lambda_1$ and $\lambda_2$), it may be considered, in practice, a resolution power of a lens that according to performance evaluation by means of Seidel's five aberrations or a wave front aberration, for example, a focal length to a ray of wavelength-band $\lambda_1$ to $\lambda_2$ with a lens having characteristics shown in FIG. 17 is the only one ($F\lambda_1 \lambda_2$).

An ordinary achromat lens for use in a microscope or the like has the same focus only to two wavelength rays in the strict sense. In practice, however, by properly setteing two wavelengths to be achromatically compensated in accordance with the purpose, the same focus is realized to two wavelength rays in the vicinity of the two wavelenths properly set, that is, a wavelength-band ray.

By way of example, in observation with the naked eye, when achromatization is made to C ray (red) and F ray (blue), a lens having the same focus is practically designed to a ray of a wavelength scope ranging from 400 to 700 nm which are sensitive to the naked eye.

From the foregoing, in FIG. 6, image forming planes to a ray of wavelength-band $\lambda_1$ to $\lambda_2$ are formed at the points B and D in place of e ray. The result is shown in FIG. 18.

Figure 18:
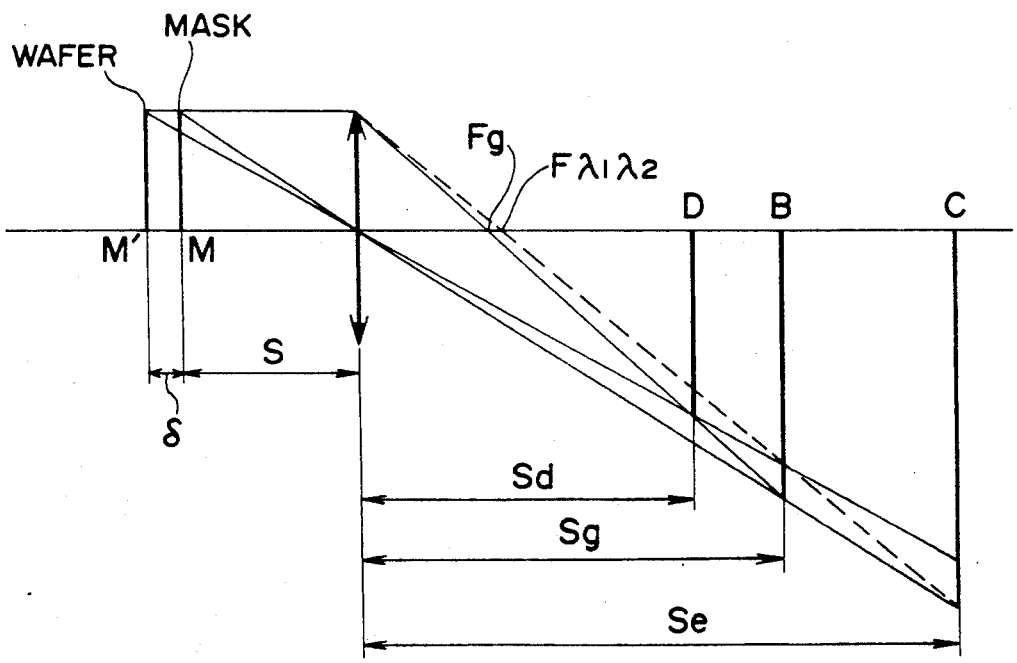
FIG. 18 is a diagram for explaining the principle of a wavelength-band ray illumination method according to the present invention.

Table 5 shows images formed at points B, C and D shown in FIG. 18.

TABLE 5

| Image forming point | Kind of image | Wavelength of image |
|---|---|---|
| B | Mask | g |
|   | Wafer | wavelength-band ray ($\lambda_1$ to $\lambda_2$) |
| C | Mask | wavelength-band ray ($\lambda_1$ to $\lambda_2$) |
| D | Wafer | g |

Figure 2:
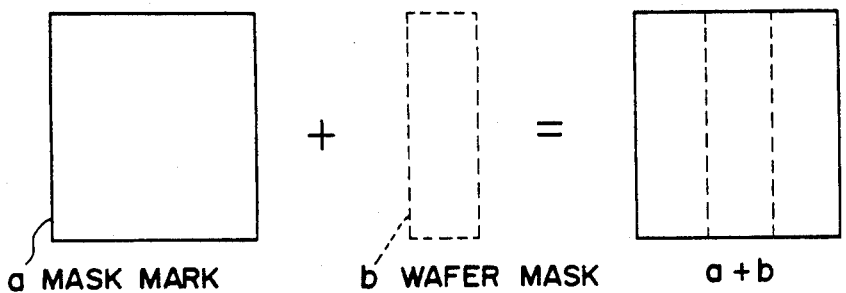
FIG. 2 is a diagram showing an example of an alignment mark of a mask and a wafer.

At the point B, images are formed by a ray of wavelength-band ($\lambda_1$ to $\lambda_2$). When configurations of alignment marks a, b of a mask and wafer are respectively a square and a rectangle which is smaller than the square, as shown in FIG. 2, images at the point B would be observed as shown in FIG. 19. Specifically, on the outer sides, are formed a sharp image a' of a mask mark a to g ray which image is in-focus and a blurred image a" of the mask mark a to a ray of wavelength-band $\lambda_1$ to $\lambda_2$ which image is out-of-focus, and on the inner sides, are formed a sharp image b' of a wafer mark b to the ray of wavelength-band $\lambda_1$ to $\lambda_2$ which image is in-focus and a blurred image b" of the wafer mark b to the g ray which image is out-of-focus.

As such, blurred images which disadvantageously reduce a resolution power are produced together with sharp images. To remove blurred images, a pattern barrier filter 20 as shown in FIG. 20 is employed. The filter 20 includes the center portion II formed by coating for transmitting a ray of wavelength-band $\lambda_1$ to $\lambda_2$ and the right and left portion I for transmitting g ray.

Making observation by superposing a pattern barrier filter 20 shown in FIG. 20 on an image forming plane shown in FIG. 19, as shown in FIG. 21, blurred images are cut off by the filter 20 and required sharp images a', b' of a mask mark and a wafer mark could be observed.

The following experiments show how a wavelength-band ray illumination reduces multiple interferences in a resist film to obtain a contrast which would be as good as that in a white ray.

Figure 22:
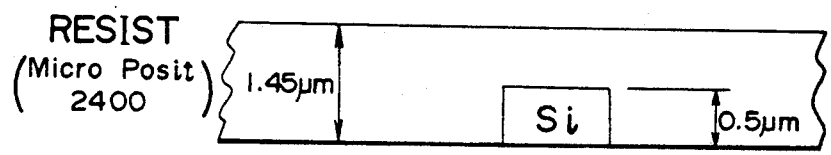
FIG. 22 is an enlarged sectional view of a process mark.

When a process mark shown in FIG. 22 is detected with a microscope, how the detection varies by a kind of illumination rays is shown in the following.

Figure 23:
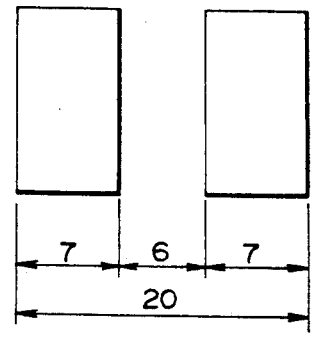
FIG. 23 is a front view showing a configuration of the process mark.
Figure 28:
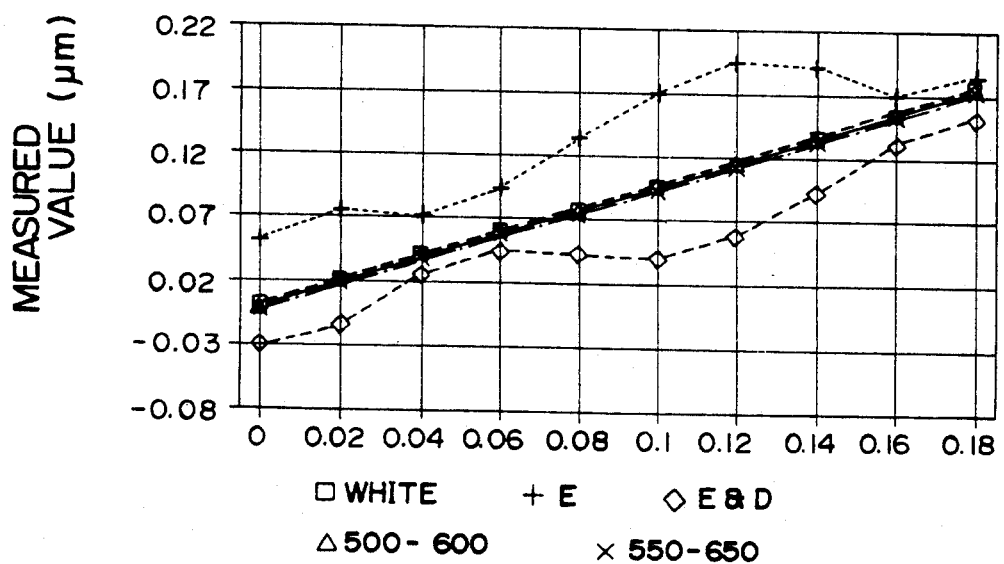
FIG. 28 is a graph showing the reduction of multiple interferences in a resist film.
Figure 26B:
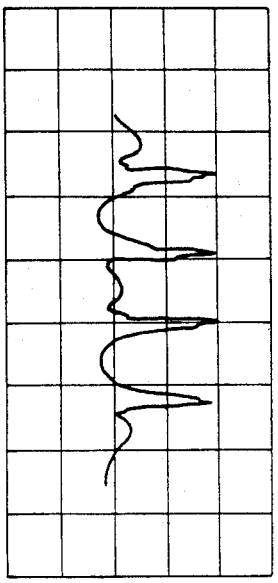
FIGS. 26(A), (B) and (C) are graphs showing a video image, video profile and first order differential value of the video profile which are detected employing a wavelength-band ray (530 to 580 nm)
Figure 26C:
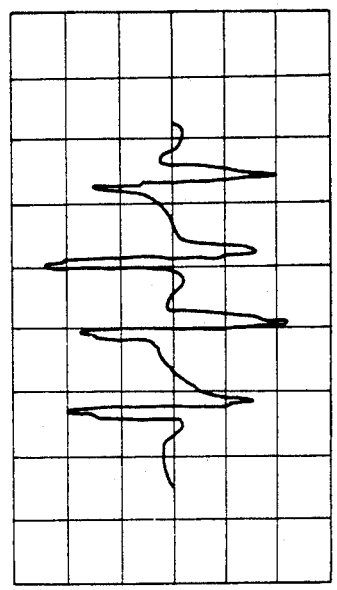
Figure 26A:
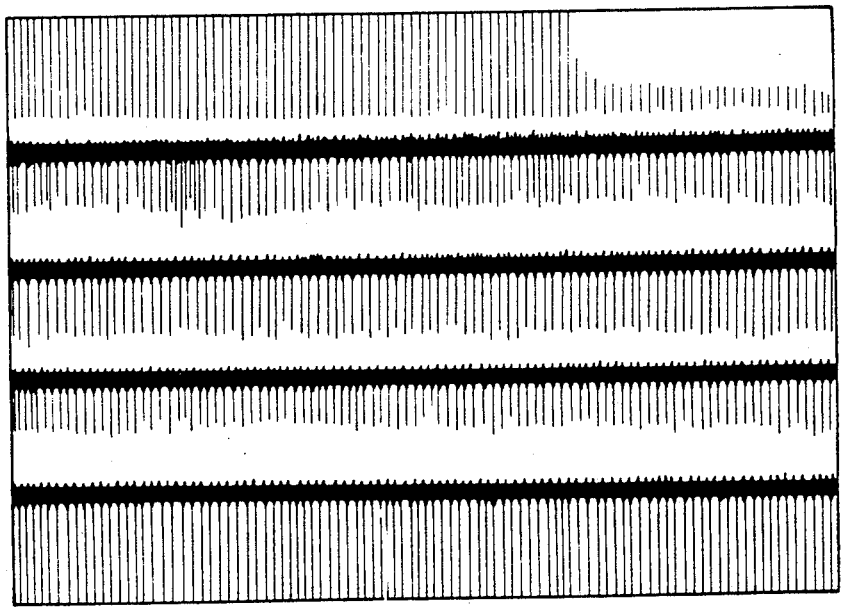

A pattern shown in FIG. 22 is normally called a WELL pattern and the configuration of its mark is as shown in FIG. 23.

As an illumination ray, the following four kinds of rays are selected.
① A single wavelength ray (e ray)
② Plural wavelength ray (e and g ray)
③ A wavelength-band ray (500 to 600 nm)
④ A white ray With respect to images detected by applying these rays, FIGS. 24 to 27 show respectively the following items.
① Video images
② Video profiles
③ First order differential values of the above ②.

From FIGS. 24 to 27, it will be found that a contrast is improved in the following order.

A single wavelength ray < Plurality wavelength rays < Wavelength-band ray ≈ white ray.

In addition, an experiment conducted with the following steps demonstrates also the fact that a detection with a wavelength-band ray illumination has the same accuracy in detection as that of a white ray illumination and effects of multiple interferences in a resist film are completely removed. A part of the results is shown in FIG. 27.

Figure 27B:
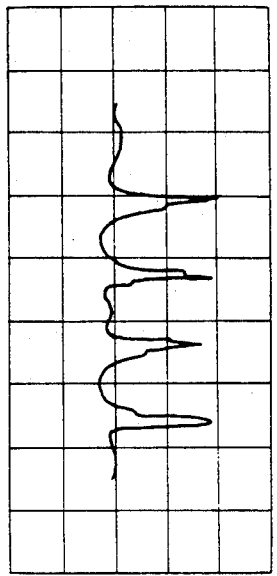
FIGS. 27(A), (B) and (C) are graphs showing a video image, video profile and first order differential value of the video profile which are detected employing a white ray.
Figure 27C:
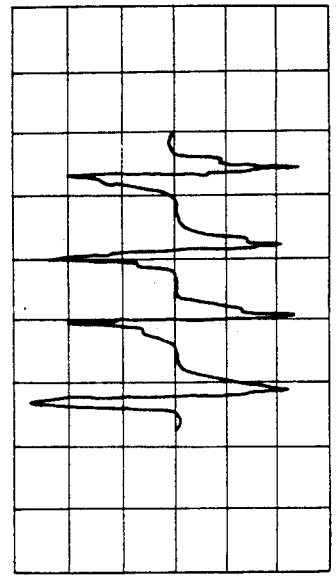
Figure 27A:
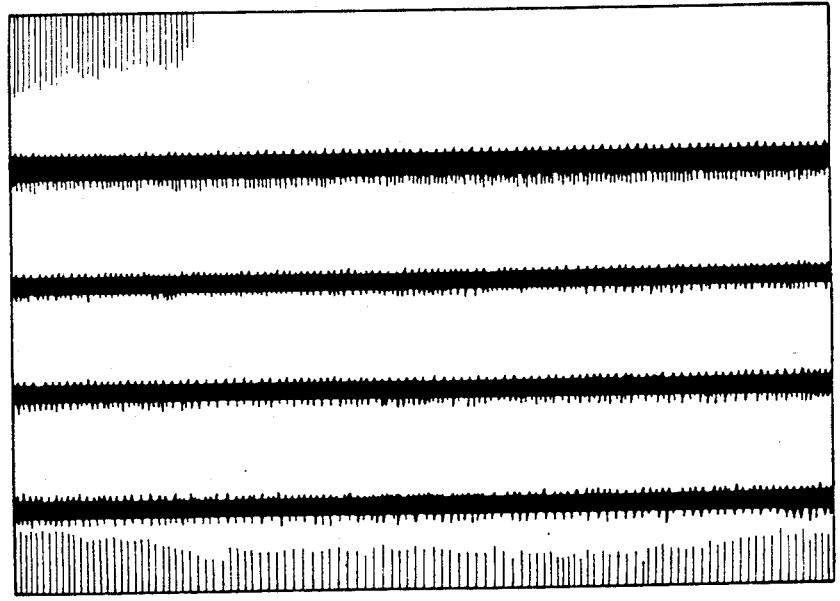

In FIG. 27, the abscissa is a reference value indicating a dimension of patterns in which a mask mark is previously shifted from a wafer mask by a pitch of 0.02 μm. The ordinate is a measured value indicating results measured by illuminating the reference value pattern by means of each of the rays. From FIG. 27, it will be found that an accuracy of detection is improved in the following order.

A single wavelength ray (e ray) < Plural wavelength rays (e and d) < a wavelength-band ray ≈ a white ray (500 to 600 nm, 550 to 650 nm).

From the above experiment, it is proved that the problem of multiple interferences in a resist film is completely solved with a wavelength-band ray.

Consequently, it is possible to easily detect images thus detained by disposing a light receiving plane such as a linear sensor at the point B. While, in the above-mentioned example, the description is made with respect to observation by superposing a pattern barrier filter 10 or 20 on an image forming plane, it will be understood that the filter may be disposed in the optical path.

Since a pattern formed on a mask plane is irrelevant to a wavelength ray and a very high contrast can always be obtained in a stable manner, a ray of short wave (below 500 nm) may be employed. In addition, not being subjected to interferences or the like it may be sufficient to illuminate with a single wavelength ray. In contrast with this, since illumination on a wafer surface is always subjected to standing wave effects, plural wavelength rays or wavelength-band rays are employed for illumination. In addition, since the longer a wavelength is, the less effects of process are, a ray of comparatively long wavelength may be selected.

As such, there are a variety of illumination rays to be assigned to a mask and a wafer. For example, a combination of a superhigh pressure mercury-arc lamp and a halogen lamp may be employed, which is generally used since it is comparatively simply and ecomomically available.

Figure 11:
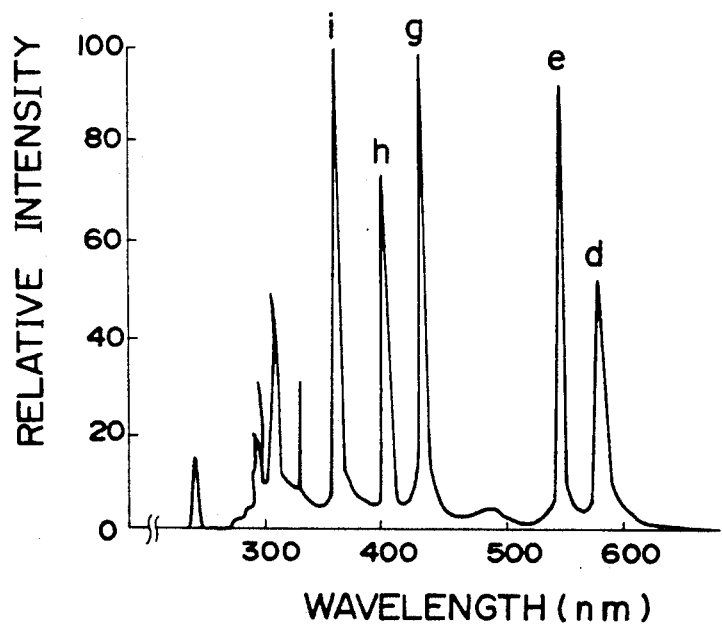
FIG. 11 is a spectral distribution diagram of a super-high mercury-arc lamp.

FIG. 11 is a diagram illuminating spectral distribution of a superhigh pressure mercury-arc lamp. Since bright lines of g, e and d ray are very high and have a sufficient intensity, the lamp is adapted as a light source for a single wavelength ray illumination. Consequently, the lamp is employed for a mask as a light source together with a band-pass filter for transmitting g ray (436 nm). For a wafer, rays of e ray (546 nm) and d ray (587 nm) or halogen lamp rays are employed for a wavelength-band ray ($\lambda_1$ to $\lambda_2$) illumination together with a band-pass filter for transmitting the wavelength-band ray.

Figure 12:
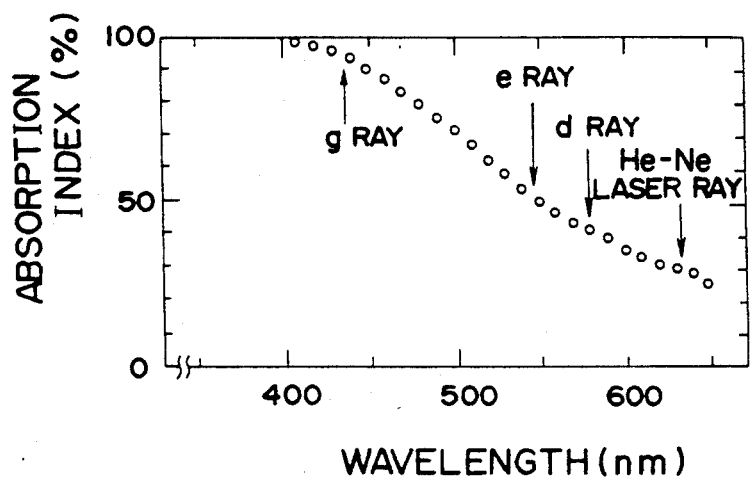
FIG. 12 is a graph for explaining dependence of a light absorption factor upon a wavelength in a lower layer resist in a multiple layer resist process.

FIG. 12 is a diagram, illuminating dependence of a light absorption factor on a wavelength in a lower layer resist in a multiple layer resist process when a thickness of the resist film is 2 μm ("Semiconductor World" Vol. 5, 1986, Press Journal Co., Ltd. P. 121). As will be seen from FIG. 12, the absorption factor of a lower layer resist film in a multiple layer resist film is below 50% for a ray of wavelength of above 500 nm. On the other hand, an absorption factor for g ray is above 90% and most of reflected rays are absorbed, resulting in that an intensity of a signal ray of a mark on a light receiving plane becomes fairly weak. Accordingly, g ray is inadequate for a light source to illuminate a wafer.

Figure 13:
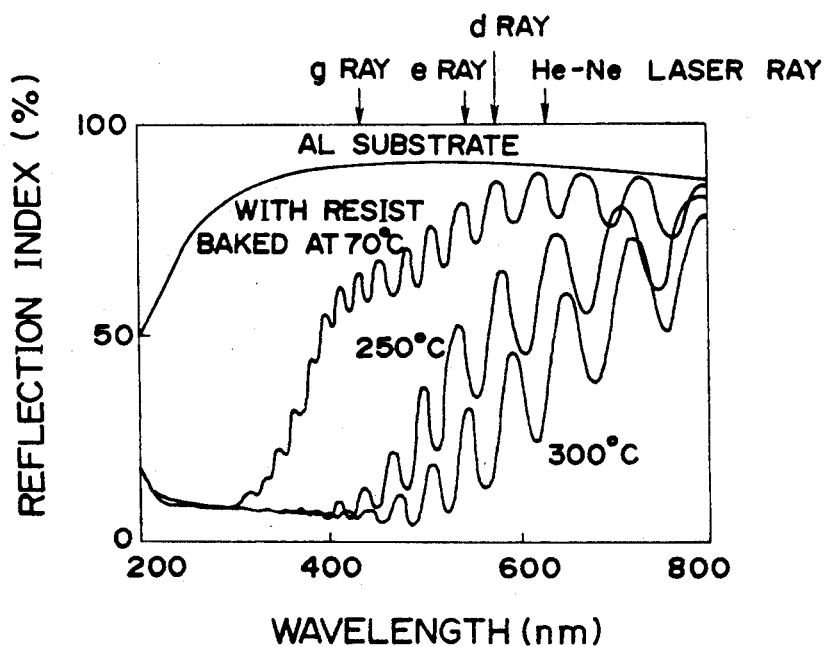
FIG. 13 is a graph showing reflection characteristics from an aluminum substrate on which a resist is coated, with respect to a wavelength and a heat treatment temperature.
Figure 14:
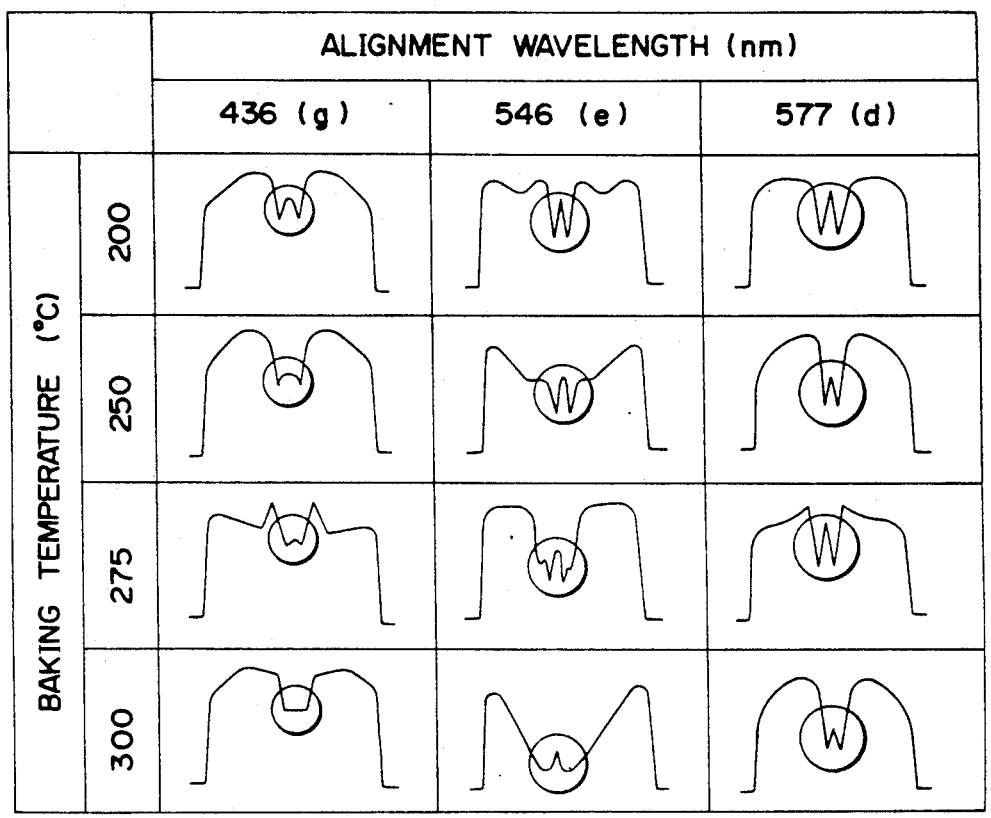
FIG. 14 is a graph showing reflection characteristics of a lower layer resist with respect to a heat treatment temperature in terms of g ray (436 nm), e ray (546 nm), d ray (587 nm) and temperature.
Figure 15:
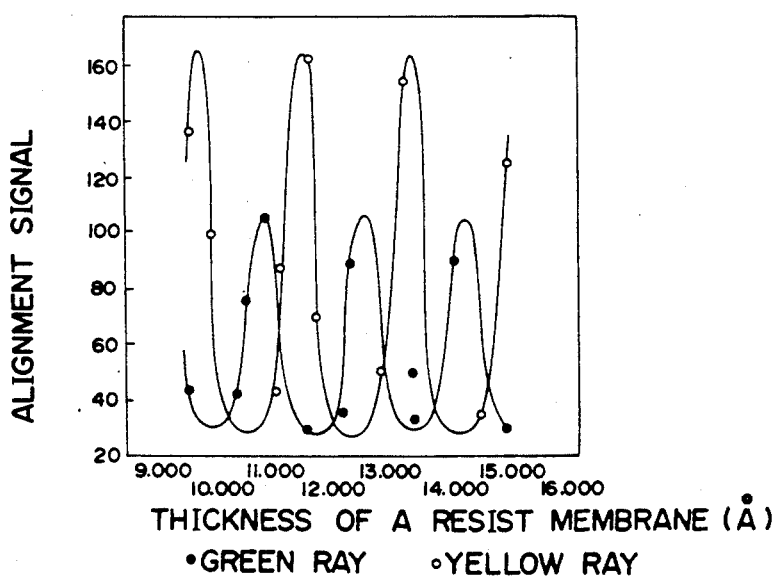
FIG. 15 is a graph showing the relation between an alignment signal by a wave-length and a film thickness.
Figure 16:
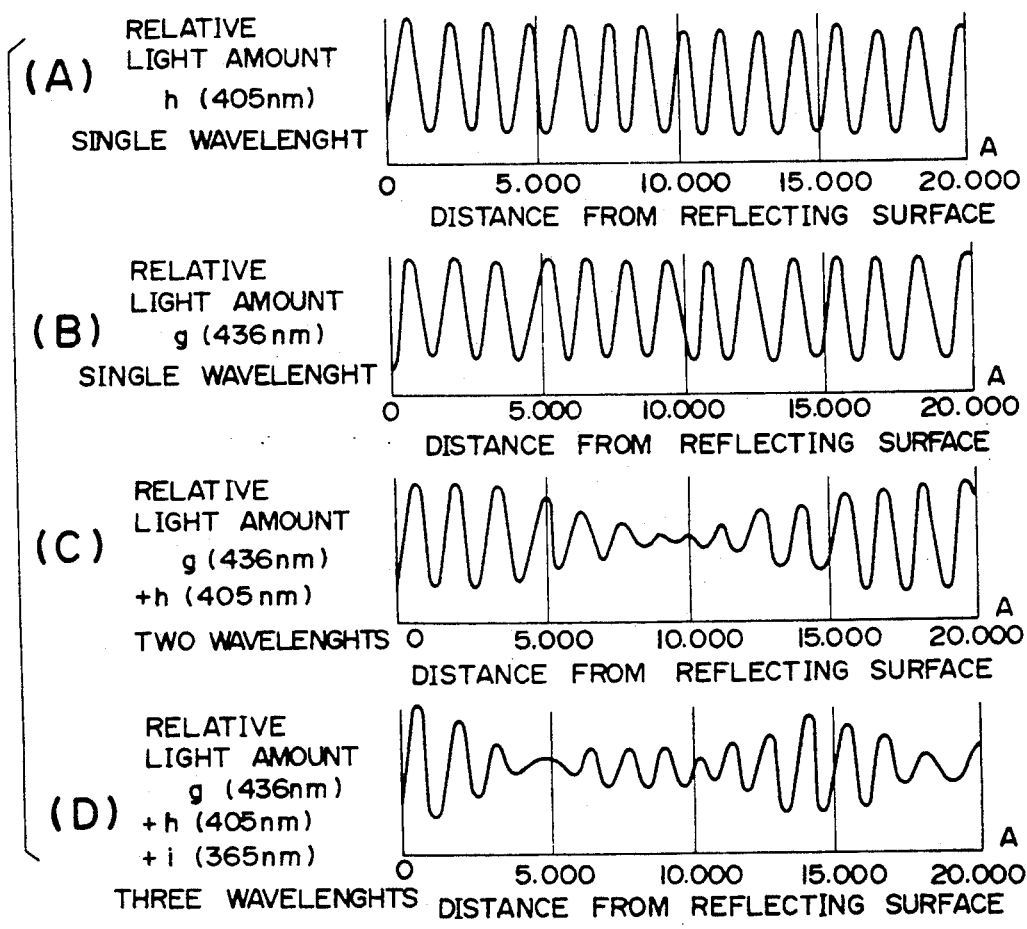
FIG. 16 is graphs showing a change in reflection intensity due to interferences when a single wavelength ray of h and g, and plural wavelength rays of g+h rays and g+h+i rays are employed.

From FIG. 13, it will be found that an absorption factor is increased with respect to rays of longer wavelengths (e to d ray) than that of g ray and a reflection intensity of a mark is increased, so that the longer wavelength rays are advantageous for alignment detection (Semiconductor world, P. 121). In FIG. 14, it will also be found that so far as a change in a signal intensity is concerned, a ray of wavelength of 500 nm is adequate for illumination of a wafer (Semiconductor World, P. 174).

EFFECTS OF THE INVENTION

As described hereinabove, the present invention makes it possible to reduce effects of a wafer process, to solve problems of a change in intensity of signal light interferences which are produced in a conventional contrast method, edge detection method and diffraction grating method, and to largely improve dependence on a process, thereby making an X-ray exposure apparatus highly accurate and obtaining a high throughput. In addition, since a ray of comparatively longer wavelength is employed as a wafer mark illumination ray, in a multiple layer process which is expected to be used in more various manners with a high integration in future, an absorption factor of a lower layer resist could be reduced, so that a high reflectivity can obtained. Furthermore, in a high tempereature treatment, a sufficient reflection characteristic is maintained to a heat treatment temperature. It is possible to always ensure an intensity of a mark signal ray in a stable manner without being affected by such process and to largely improve dependence on multiple layer processes.

What is claimed is:

1. In illumination methods for use an apparatus for detecting a position by employing a lens system having axial chromatic aberration in a position detector for detecting a relative position between first and second object which are disposed at a minute interval in the optical axis direction: an illumination method with plural color rays for use in a double-focus detector utilizing chromatic aberration, characterized in that a single ray whose wavelength is below 500 nm is applied to said first object and two rays whose wavelengths are above 500 nm are applied to said second object, by employing an image forming plane of said first object with respect to said single wavelength ray as one focal plane of said lens system and the same image forming plane of said second object with respect to said two wavelength rays as the other focal plane of said lens system.

2. In an illumination method in an apparatus for detecting a position by employing a lens system having axial chromatic aberration in a position detector for detecting a relative position between first and second object which are disposed at a minute interval in the optical axis direction: an illumination method with a wavelength-band ray in a double-focus detector utilizing chromatic aberration, characterized in that a single ray whose wavelength is below 500 nm is applied to said first object and wavelength-band rays whose wavelengths are above 500 nm are applied to said second object, by employing an image forming plane of said first object with respect to said single wavelength ray as one focal plane of said lens system and the same image forming plane of said second object with respect to rays having said wavelength-band rays as the other focal plane of said lens system.

* * * * *